(12) United States Patent
Takata

(10) Patent No.: US 11,929,726 B2
(45) Date of Patent: Mar. 12, 2024

(54) MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 712 days.

(21) Appl. No.: 17/075,751

(22) Filed: Oct. 21, 2020

(65) Prior Publication Data

US 2021/0044271 A1 Feb. 11, 2021

Related U.S. Application Data

(63) Continuation of application No. PCT/JP2019/022224, filed on Jun. 4, 2019.

(30) Foreign Application Priority Data

Jun. 5, 2018 (JP) ................................. 2018-107839

(51) Int. Cl.
*H03H 9/00* (2006.01)
*H03H 9/145* (2006.01)
(Continued)

(52) U.S. Cl.
CPC .......... *H03H 9/0009* (2013.01); *H03H 9/145* (2013.01); *H03H 9/25* (2013.01); *H03H 9/64* (2013.01); *H03H 9/72* (2013.01)

(58) Field of Classification Search
CPC ........ H03H 9/0009; H03H 9/145; H03H 9/25; H03H 9/64; H03H 9/72
See application file for complete search history.

(56) References Cited

U.S. PATENT DOCUMENTS

| | | | |
|---|---|---|---|
| 2007/0267942 A1* | 11/2007 | Matsumoto | H03H 9/178 310/366 |
| 2016/0261249 A1* | 9/2016 | Takamine | H03H 9/706 |

(Continued)

FOREIGN PATENT DOCUMENTS

| | | |
|---|---|---|
| JP | 2006-345027 A | 12/2006 |
| WO | 2016/208670 A1 | 12/2016 |

(Continued)

OTHER PUBLICATIONS

Official Communication issued in International Patent Application No. PCT/JP2019/022224, dated Aug. 20, 2019.

*Primary Examiner* — Samuel S Outten
(74) *Attorney, Agent, or Firm* — Keating & Bennett, LLP

(57) ABSTRACT

A multiplexer includes a common terminal, a first filter connected to the common terminal, a wiring line connecting the common terminal and the reception filter to each other, a second filter connected to a connection node on the wiring line, a third filter connected to a connection node on the wiring line, a wiring line connecting the connection node and the transmission filter to each other, a wiring line connecting the connection node and the first filter to each other, and an inductor connected between a wiring region of the wiring line that extends from the connection node to the first filter and the ground or between the wiring line and the ground. The length of a portion of the wiring line extending from the common terminal to the connection node is longer than the length of a portion of the wiring line extending from the common terminal to the connection node.

13 Claims, 8 Drawing Sheets

(51) Int. Cl.
*H03H 9/25* (2006.01)
*H03H 9/64* (2006.01)
*H03H 9/72* (2006.01)

(56) References Cited

U.S. PATENT DOCUMENTS

2017/0133999 A1* 5/2017 Ishizuka .................. H03H 9/64
2018/0041194 A1* 2/2018 Ito ........................ H03H 9/6483
2018/0109243 A1 4/2018 Takamine
2018/0302059 A1 10/2018 Eihama

FOREIGN PATENT DOCUMENTS

WO 2017/115579 A1 7/2017
WO 2017/159834 A1 9/2017

* cited by examiner

EMBODIMENT

EMBODIMENT

FIRST COMPARATIVE EXAMPLE

FIRST COMPARATIVE EXAMPLE

SECOND COMPARATIVE EXAMPLE

SECOND COMPARATIVE EXAMPLE

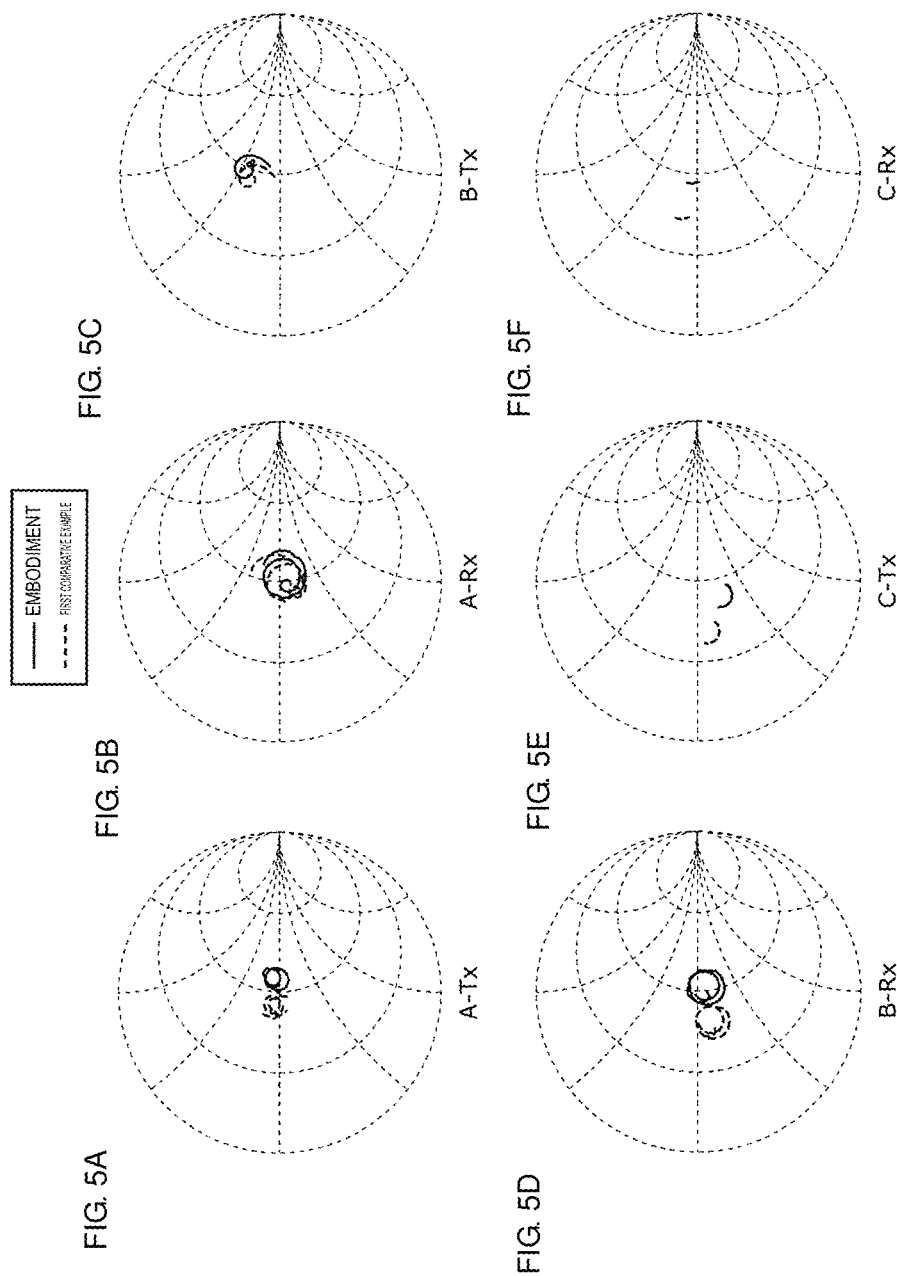

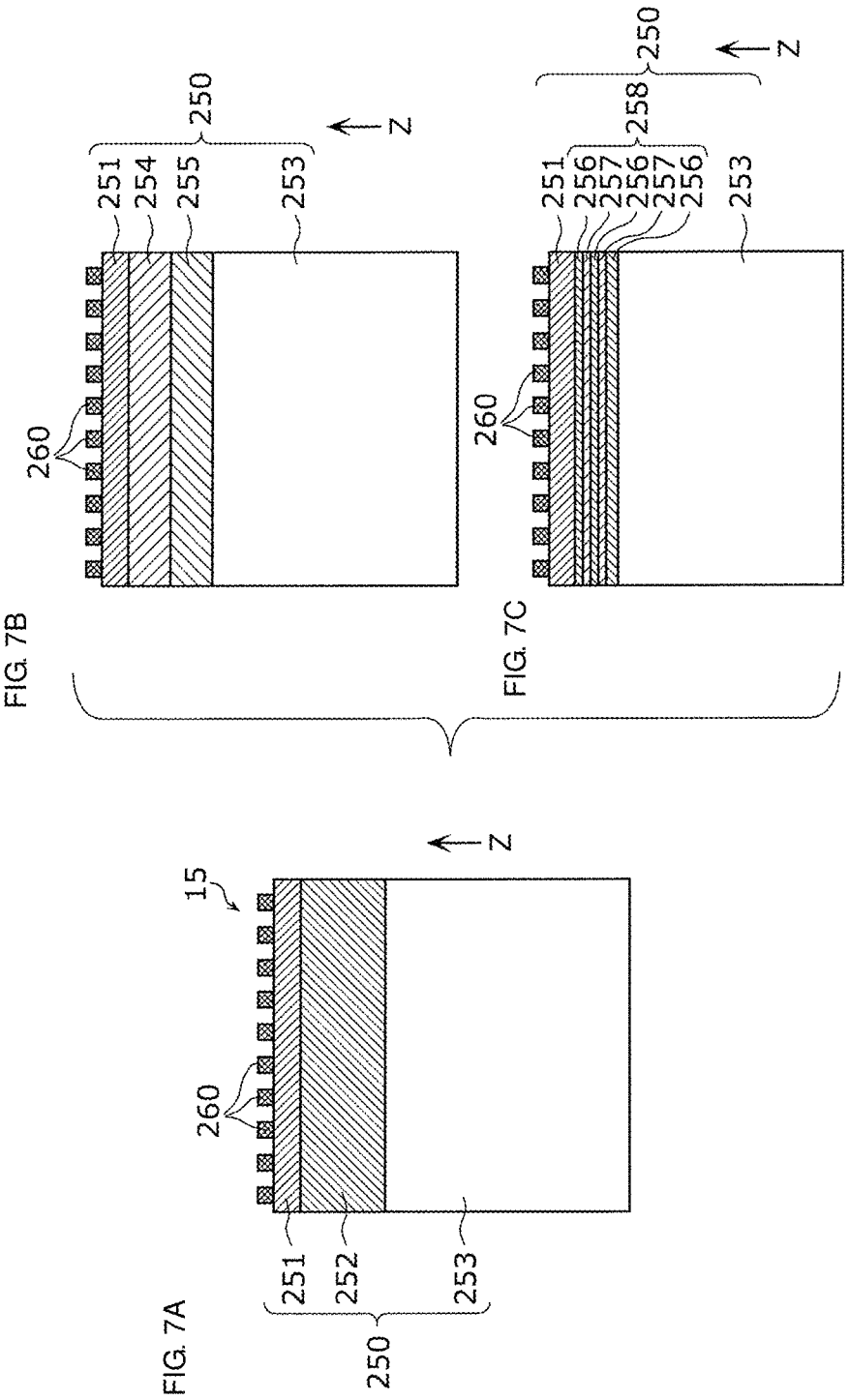

MULTIPLEXER

CROSS REFERENCE TO RELATED APPLICATIONS

This application claims the benefit of priority to Japanese Patent Application No. 2018-107839 filed on Jun. 5, 2018 and is a Continuation Application of PCT Application No. PCT/JP2019/022224 filed on Jun. 4, 2019. The entire contents of each application are hereby incorporated herein by reference.

BACKGROUND OF THE INVENTION

1. Field of the Invention

The present invention relates to a multiplexer that includes an acoustic wave filter.

2. Description of the Related Art

In recent years, mobile communication terminals have been required to operate in a plurality of communication bands (frequency bands) and to support a plurality of wireless systems, that is, each mobile communication terminal has been required to become a multi-band and multi-mode terminal. In order to meet this requirement, a small-sized multiplexer that demultiplexes/multiplexes high frequency signals of a plurality of communication bands is disposed in a front-end section that is connected to an antenna.

Japanese Unexamined Patent Application Publication No. 2006-345027 (FIG. 8) discloses a composite filter circuit (a multiplexer) including three filters (a low-pass filter, a bandpass filter, and a high-pass filter) and an inductance element that is connected in parallel to a common port (a common terminal) (that is connected to a common port and the ground).

In the multiplexer described in Japanese Unexamined Patent Application Publication No. 2006-345027, the inductance element connected in parallel to the common terminal is provided in order to perform impedance matching between an external circuit (e.g., an antenna), which is connected to the common terminal, and the above-mentioned three filters.

However, when the inductance element is connected to the common terminal so as to be positioned closer to the common terminal than the three filters are in order to establish the circuit connection of the multiplexer, the impedance matching between the external circuit (e.g., an antenna) and the three filters cannot be performed accurately. More specifically, the combined impedance of the three filters can be shifted to an inductive side by the inductance element, and thus, the impedance of each of the filters is designed beforehand to be capacitive. For example, an acoustic wave filter is used as each of the filters having a capacitive impedance. In this case, although the combined impedance of the three filters that is more shifted to the capacitive side and the low impedance side than the impedance of each filter can be shifted to the inductive side by the inductance element, it is difficult to bring the combined impedance close to a reference impedance.

SUMMARY OF THE INVENTION

Preferred embodiments of the present invention provide multiplexers that each include three or more acoustic wave filters connected to a common terminal and that are each able to accurately perform impedance matching between the acoustic wave filters and an external circuit connected to the common terminal.

A multiplexer according to a preferred embodiment of the present invention includes a common terminal, a first acoustic wave filter connected to the common terminal, a first wiring line connecting the common terminal and the first acoustic wave filter to each other, a second acoustic wave filter connected to a first connection node on the first wiring line, a third acoustic wave filter connected to a second connection node on the first wiring line, a second wiring line connecting the first connection node and the second acoustic wave filter to each other, a third wiring line connecting the second connection node and the third acoustic wave filter to each other, and an inductance element connected between a wiring region of the first wiring line that extends from the first connection node to the first acoustic wave filter and a ground or between the second wiring line and the ground. A length of a portion of the first wiring line extending from the common terminal to the first connection node is longer than a length of a portion of the first wiring line extending from the common terminal to the second connection node.

Multiplexers according to preferred embodiments of the present invention are each able to perform, with high accuracy, impedance matching with an external circuit that is connected to a common terminal.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A to 5F include Smith charts comparing an impedance of the multiplexer according to the preferred embodiment of the present invention and an impedance of the multiplexer according to the first comparative example for each pass band.

FIGS. 7A to 7C include sectional views illustrating a resonator of one of acoustic wave filters included in the multiplexer according to the preferred embodiment of the present invention.

Figure 1A:
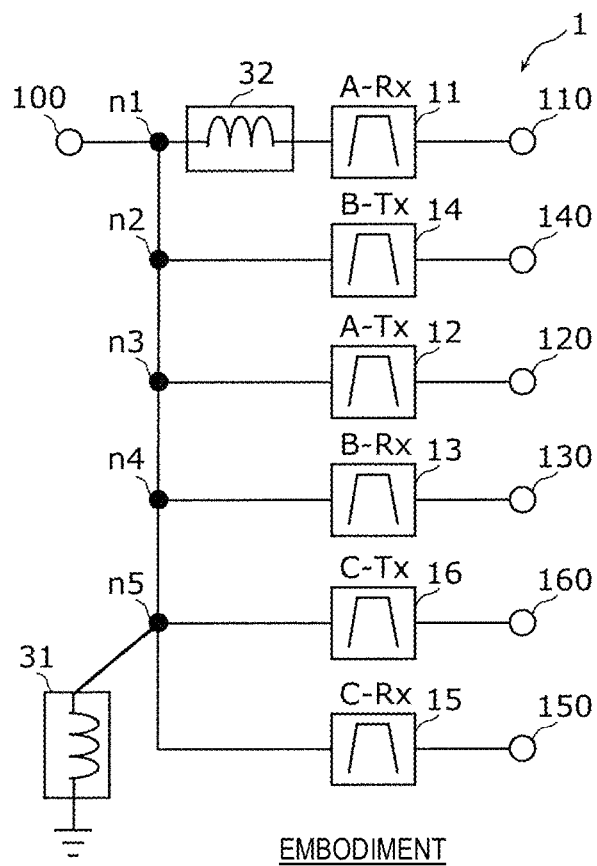
FIG. 1A is a diagram illustrating circuit elements included in a multiplexer according to a preferred embodiment of the present invention.

DETAILED DESCRIPTION OF THE
PREFERRED EMBODIMENTS

Preferred embodiments of the present invention will be described in detail below with reference to the drawings. Note that the preferred embodiments, which will be described below, are comprehensive or specific examples. Numerical values, shapes, materials, components, arrangement positions and connection configurations of the components, and so forth that are described in the following preferred embodiments are examples and are not intended to limit the scope of the present invention. Among the components in the following preferred embodiments, the components that are not mentioned in the independent claim will be described as arbitrary or optional components. In addition, the sizes of the components illustrated in the drawings or the ratio of their sizes are not necessarily exact.

1. Arrangement in Multiplexer

FIG. 1A is a diagram illustrating circuit elements that are included in a multiplexer 1 according to a preferred embodiment of the present invention. As illustrated in FIG. 1A, the multiplexer 1 includes a common terminal 100, reception filters 11, 13, 15, transmission filters 12, 14, 16, inductors 31, 32, reception output terminals 110, 130, 150, and transmission input terminals 120, 140, 160.

The multiplexer 1 is connected to, for example, an external circuit such as an antenna element at the common terminal 100. The reception output terminals 110, 130, and 150 are connected to, for example, a reception amplifier circuit. The transmission input terminals 120, 140, and 160 are connected to, for example, a transmission amplifier circuit.

The reception filter 11 includes an input end connected to a connection node n1 (second connection node) with the inductor 32 interposed between the input end of the reception filter 11 and the connection node n1. An output end of the reception filter 11 is connected to the reception output terminal 110. The reception filter 11 is a third acoustic wave filter whose pass band is set to a reception band of a communication band A. For example, the reception band (about 1930 MHz to about 1995 MHz) of long term evolution (LTE) band 25 is applied to the reception band of the communication band A.

The transmission filter 12 includes an output end connected to a connection node n3 (second connection node) and an input end connected to the transmission input terminal 120. The transmission filter 12 is a third acoustic wave filter whose pass band is set to a transmission band of the communication band A. For example, the transmission band (about 1850 MHz to about 1915 MHz) of LTE band 25 is applied to the transmission band of the communication band A.

The reception filter 13 includes an input end connected to a connection node n4 (second connection node) and an output end connected to the reception output terminal 130. The reception filter 13 is a third acoustic wave filter whose pass band is set to a reception band of a communication band B. For example, the reception band (about 2110 MHz to about 2200 MHz) of LTE band 66 is applied to the reception band of the communication band B.

The transmission filter 14 includes an output end connected to a connection node n2 (second connection node) and an input end connected to the transmission input terminal 140. The transmission filter 14 is a third acoustic wave filter whose pass band is set to a transmission band of the communication band B. For example, the transmission band (about 1710 MHz to about 1780 MHz) of LTE band 66 is applied to the transmission band of the communication band B.

The reception filter 15 includes an input end connected to a connection node n5 (first connection node) and an output end connected to the reception output terminal 150. The reception filter 15 is a first acoustic wave filter whose pass band is set to a reception band of a communication band C. For example, the reception band (about 2350 MH to about 2360 MHz) of LTE band 30 is applied to the reception band of the communication band C.

The transmission filter 16 includes an output end connected to the connection node n5 (first connection node) and an input end connected to the transmission input terminal 160. The transmission filter 16 is a second acoustic wave filter whose pass band is set to a transmission band of the communication band C. For example, the transmission band (about 2305 MHz to about 2315 MHz) of LTE band 30 is applied to the transmission band of the communication band C.

Structures of the above-described six acoustic wave filters will be described below.

The connection nodes n1, n2, n3, n4, and n5 are all nodes on a wiring line that connects the common terminal 100 and the acoustic wave filters.

The inductor 31 is an inductance element connected between the connection node n5 and the ground and is an impedance-matching element that matches the impedances of the reception and transmission filters 11, 12, 13, 14, 15, and 16 to the impedance of an external circuit connected to the common terminal 100.

The inductor 32 is an inductance element connected in series between the connection node n1 and the input end of the reception filter 11 and is a phase-adjusting element that adjusts the phase of the impedance when the reception filter 11 is viewed from the connection node n1.

However, the inductor 32 is not a necessary component in the multiplexer according to the present preferred embodiment.

In addition, the multiplexer according to the present preferred embodiment does not need to include six acoustic wave filters and may at least include three or more acoustic wave filters. For example, the multiplexer may at least include the reception filter 15, which is the first acoustic wave filter, the transmission filter 16, which is the second acoustic wave filter, and at least one of the reception and transmission filters 11, 12, 13, and 14, which are the third acoustic wave filters. Furthermore, each of the three or more acoustic wave filters included in the multiplexer according to the present preferred embodiment may be either a transmission filter or a reception filter.

The multiplexer 1 according to the present preferred embodiment includes circuitry in which the six acoustic wave filters, which are the reception filters 11, 13, 15 and the transmission filters 12, 14, 16, are electrically connected to the common terminal 100. In the multiplexer 1 according to the present preferred embodiment, the circuit elements that provide the above-described circuitry are provided with features and in a structure that does not exist in the related art. The arrangement of the circuit elements included in the multiplexer 1 according to the present preferred embodiment will be described in detail below.

Figure 1B:
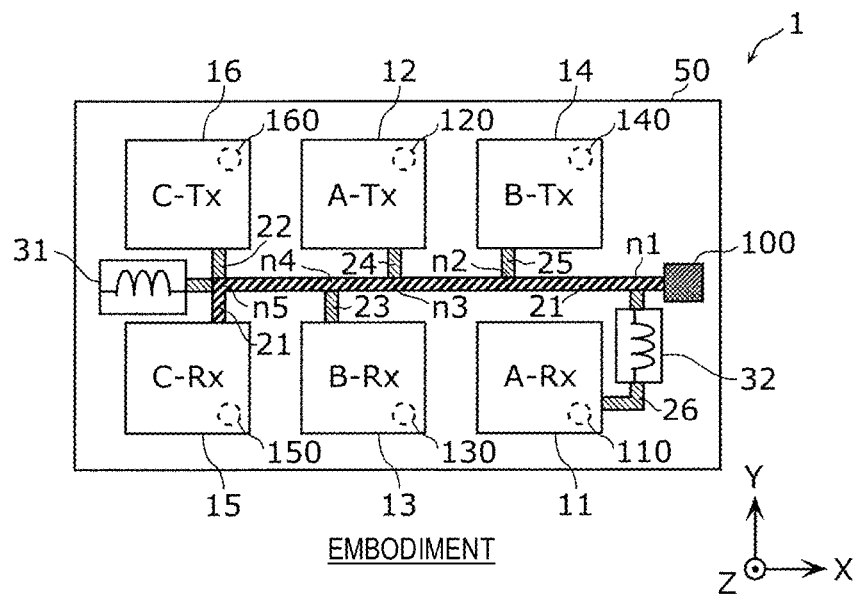
FIG. 1B is a plan view illustrating the multiplexer according to the preferred embodiment of the present invention.

FIG. 1B is a plan view illustrating the multiplexer 1 according to the present preferred embodiment. As illustrated in FIG. 1B, the multiplexer 1 according to the present preferred embodiment further includes, in addition to the circuit elements illustrated in FIG. 1A, a connection wiring line that connects the common terminal 100 and the acoustic wave filters. The above-described connection wiring line includes wiring lines 21, 22, 23, 24, 25, and 26.

The wiring line 21 is a first wiring line that connects the common terminal 100 and the reception filter 15. The wiring line 22 is a second wiring line that connects the connection node n5 and the transmission filter 16. The wiring line 23 is a third wiring line that connects the connection node n4 and the reception filter 13. The wiring line 24 is a third wiring line that connects the connection node n3 and the transmission filter 12. The wiring line 25 is a third wiring line that connects the connection node n2 and the transmission filter 14. The wiring line 26 is a third wiring line that connects the connection node n1 and the reception filter 11.

Here, the length of the wiring line extending from the common terminal 100 to the connection node n5 is longer than the length of each of the wiring line extending from the common terminal 100 to the connection node n4, the wiring line extending from the common terminal 100 to the connection node n3, the wiring line extending from the common terminal 100 to the connection node n2, and the wiring line extending from the common terminal 100 to the connection node n1. The inductor 31 is connected to the connection node n5 without any of the other connection nodes interposed between the inductor 31 and the connection node n5. In other words, the inductor 31 is connected to the connection node n5 that is one of the connection nodes n1 to n5 and that is spaced apart from the common terminal 100 by the largest wiring distance.

With the above-described features and structure in the multiplexer 1 according to the preferred embodiment, impedance matching with an external circuit that is connected to the common terminal 100 is able to be performed with high accuracy.

The inductor 31 is not limited to being connected between the connection node n5 and the ground and may, for example, at least be connected between the wiring line extending from the connection node n5 to the input end of the reception filter 15 and the ground or between the wiring line extending from the connection node n5 to the output end of the transmission filter 16 and the ground.

As illustrated in FIG. 1B, the multiplexer 1 according to the present preferred embodiment may further include a mounting substrate 50. The common terminal 100, the reception filters 11, 13, 15, and the transmission filters 12, 14, 16 are mounted on the mounting substrate 50. In addition, the wiring lines 21 to 26 are provided on the mounting substrate 50. Each of the inductors 31 and 32 may be a chip inductor that is surface-mounted on the mounting substrate 50 or may be an inductor that is defined by a coil pattern in the mounting substrate 50.

According to the above-described configuration that includes the mounting substrate 50, since the wiring lines 21 to 26 are provided on the mounting substrate 50, on which the acoustic wave filters are mounted, and the inductor 31 is mounted on the mounting substrate 50, the multiplexer 1 is able to be provided as a module with a significantly reduced size.

The mounting substrate 50 may be a multilayer substrate that includes a plurality of dielectric layers. As a substrate that propagates a high-frequency signal with a low loss, a low dielectric constant substrate having a low dielectric loss is preferably provided, for example. In the case of a multilayer substrate having a low dielectric constant, however, the phase change of the impedance of each of the acoustic wave filters due to the above-mentioned wiring lines 21 to 26 is relatively high. Even in this case, with the above-described configuration of the multiplexer 1 according to the present preferred embodiment, the inductor 31 is connected to the connection node n5 so as to be positioned near the reception filter 15, which is spaced apart from the common terminal 100 by the largest wiring distance, without the other connection nodes or the other acoustic wave filters interposed between the inductor 31 and the connection node n5. Accordingly, the impedances of the reception and transmission filters 11, 12, 13, 14, 15, and 16 when viewed from the common terminal 100 can are able to be matched to a reference impedance (e.g., about 50Ω) while the dielectric loss of the mounting substrate 50 is significantly reduced.

In the multiplexer 1 according to the present preferred embodiment, when the mounting substrate 50 is viewed in plan view (viewed in the z-axis direction), for example, the size of each of the acoustic wave filters is about 0.8 mm×about 1.1 mm, and the size of each of the inductors 31 and 32 is about 0.4 mm×about 0.2 mm. The size of the multiplexer 1 is about 4.8 mm×about 3.5 mm. Note that these sizes are provided in the case where LTE bands 25, 66, and 30, which have been mentioned above, are applied to the acoustic wave filters and where a multilayer substrate including a plurality of dielectric layers is used as the mounting substrate 50.

2. Reduction in Size of Multiplexer and Impedance Matching

The multiplexer 1 according to the present preferred embodiment is significantly reduced in size and provides significantly improved impedance matching when compared with a multiplexer of the related art, as described below. First, a multiplexer according to a first comparative example and a multiplexer according to a second comparative example, each of which is a multiplexer of the related art, will be described.

Figure 2A:
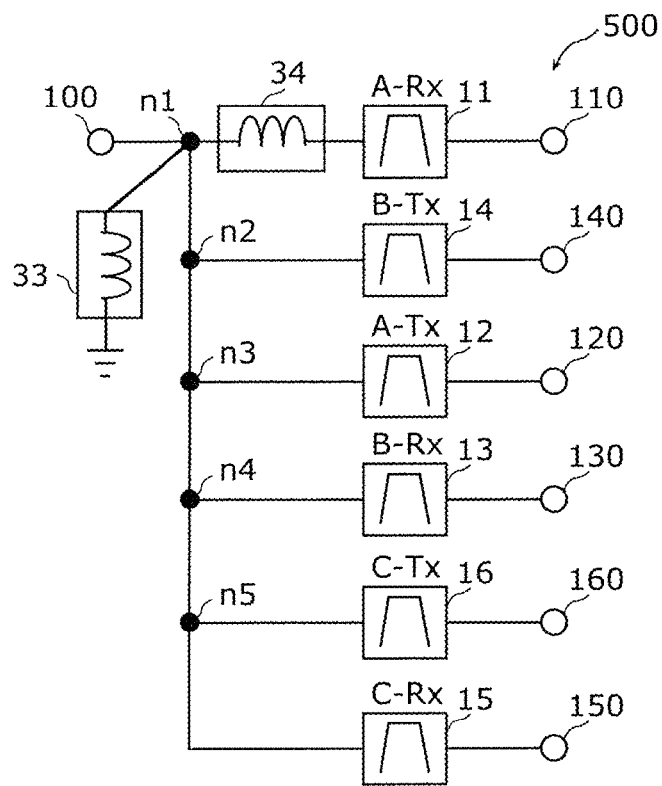
FIG. 2A is a diagram illustrating circuit elements included in a multiplexer according to a first comparative example.

FIG. 2A is a diagram illustrating circuit elements included in a multiplexer 500 according to the first comparative example. As illustrated in FIG. 2A, the multiplexer 500 includes the common terminal 100, the reception filters 11, 13, 15, the transmission filters 12, 14, 16, inductors 33, 34, the reception output terminals 110, 130, 150, and the transmission input terminals 120, 140, 160. The features and structure of inductance elements in the multiplexer 500 according to the first comparative example are different from the multiplexer 1 according to the present preferred embodiment. Description of features or elements of the multiplexer 500 according to the first comparative example that are the same as or similar to the multiplexer 1 according to the present preferred embodiment will be omitted, and features and elements of the multiplexer 500 that are different from the multiplexer 1 will be mainly described.

The inductor 33 is an inductance element connected between the connection node n1 and the ground and is an impedance-matching element that matches the impedances of the reception and transmission filters 11, 12, 13, 14, 15, and 16 to the impedance of an external circuit connected to the common terminal 100.

The inductor 34 is an inductance element connected in series between the connection node n1 and the input end of the reception filter 11 and operates similar to that of the inductor 32 according to the present preferred embodiment.

Figure 2B:
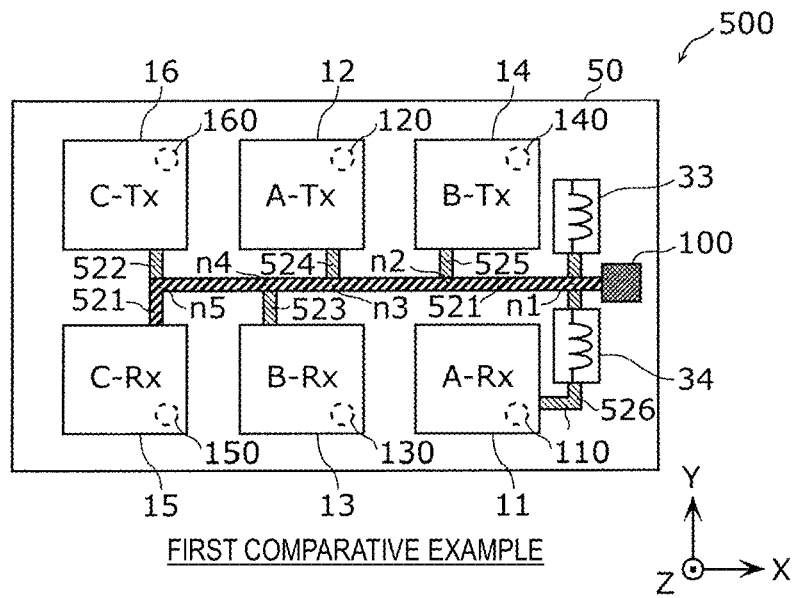
FIG. 2B is a plan view illustrating the multiplexer according to the first comparative example.

FIG. 2B is a plan view illustrating the multiplexer 500 according to the first comparative example. As illustrated in FIG. 2B, the multiplexer 500 according to the first comparative example includes, in addition to the circuit elements illustrated in FIG. 2A, a connection wiring line that connects the common terminal 100 and the acoustic wave filters. The above-described connection wiring line includes wiring lines 521, 522, 523, 524, 525, and 526.

The wiring line 521 is a first wiring line that connects the common terminal 100 and the reception filter 15. The wiring line 522 is a second wiring line that connects the connection node n5 and the transmission filter 16. The wiring line 523 is a third wiring line that connects the connection node n4 and the reception filter 13. The wiring line 524 is a third wiring line that connects the connection node n3 and the transmission filter 12. The wiring line 525 is a third wiring line that connects the connection node n2 and the transmission filter 14. The wiring line 526 is a third wiring line that connects the connection node n1 and the reception filter 11.

The length of the wiring line extending from the common terminal 100 to the connection node n1 is shorter than the length of each of the wiring line extending from the common terminal 100 to the connection node n5, the wiring line extending from the common terminal 100 to the connection node n4, the wiring line extending from the common terminal 100 to the connection node n3, and the wiring line extending from the common terminal 100 to the connection node n2. The inductor 33 is connected to the connection node n1 without the other connection nodes provided between the inductor 33 and the connection node n1. In other words, the inductor 33 is connected to the connection node n1 that is one of the connection nodes n1 to n5 and that is spaced apart from the common terminal 100 by the smallest wiring distance.

With the above-described features and structure in the multiplexer 500 according to the first comparative example, impedance matching with an external circuit that is connected to the common terminal 100 is able to be performed with high accuracy.

In the multiplexer 500 according to the first comparative example, when the mounting substrate 50 is viewed in plan view (viewed in the z-axis direction), for example, the size of each of the acoustic wave filters is about 0.8 mm×about 1.1 mm, and the size of each of the inductors 33 and 34 is about 0.4 mm×about 0.2 mm. The size of the multiplexer 500 is about 4.8 mm×about 3.5 mm and is similar to the size of the multiplexer 1 according to the present preferred embodiment. The sizes of the multiplexer 1 and the multiplexer 500 are provided in the case where LTE bands 25, 66, and 30, which have been described above, are applied to the acoustic wave filters and where a multilayer substrate including a plurality of dielectric layers is used as the mounting substrate 50.

Figure 3A:
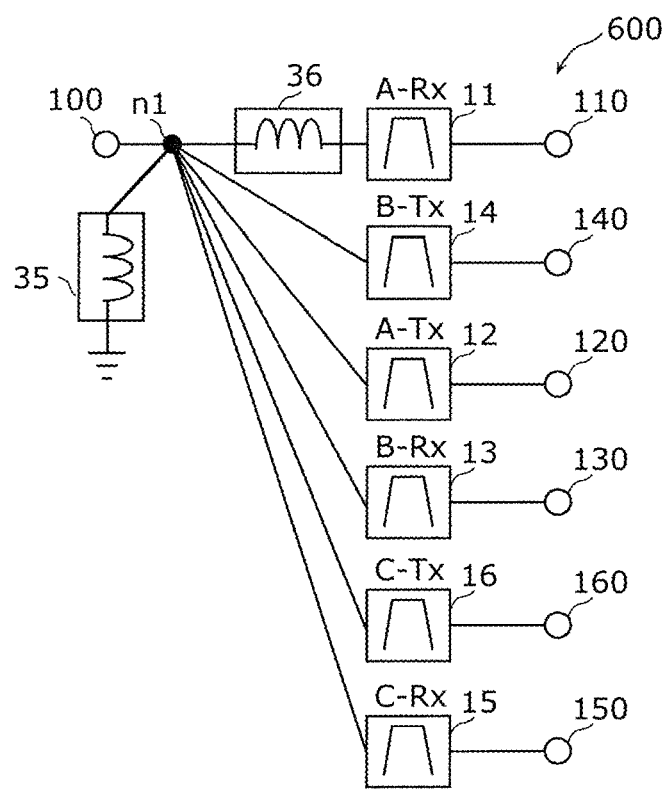
FIG. 3A is a diagram illustrating circuit elements included in a multiplexer according to a second comparative example.

FIG. 3A is a diagram illustrating circuit elements included in a multiplexer 600 according to the second comparative example. As illustrated in FIG. 3A, the multiplexer 600 includes the common terminal 100, the reception filters 11, 13, 15, the transmission filters 12, 14, 16, inductors 35, 36, the reception output terminals 110, 130, 150, and the transmission input terminals 120, 140, 160. The features and structure of inductance elements and the wiring in the multiplexer 600 according to the second comparative example are different from those in the multiplexer 1 according to the present preferred embodiment. Description of the features and elements of the multiplexer 600 according to the second comparative example that are the same as or similar to the features and elements of the multiplexer 1 according to the present preferred embodiment will be omitted, and features and elements of the multiplexer 600 that are different from that of the multiplexer 1 will be mainly described.

The inductor 35 is an inductance element connected between the connection node n1 and the ground and is an impedance-matching element that matches the impedances of the reception and transmission filters 11, 12, 13, 14, 15, and 16 to the impedance of an external circuit connected to the common terminal 100.

The inductor 36 is an inductance element connected in series between the connection node n1 and the input end of the reception filter 11 and operates similar to that of the inductor 32 according to the present preferred embodiment.

Figure 3B:
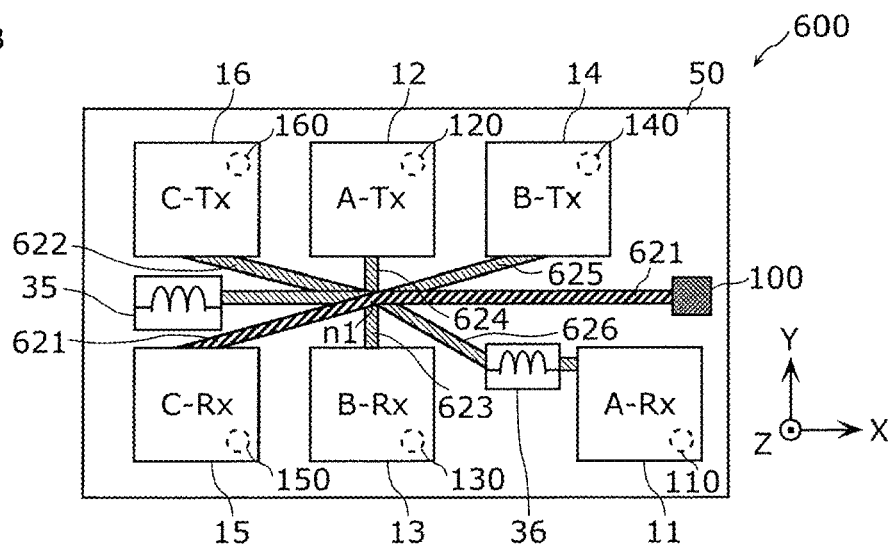
FIG. 3B is a plan view illustrating the multiplexer according to the second comparative example.

FIG. 3B is a plan view illustrating the multiplexer 600 according to the second comparative example. As illustrated in FIG. 3B, the multiplexer 600 according to the second comparative example includes, in addition to the circuit elements illustrated in FIG. 3A, a connection wiring line that connects the common terminal 100 and the acoustic wave filters. The connection wiring line includes wiring lines 621, 622, 623, 624, 625, and 626.

The wiring line 621 connects the common terminal 100 and the reception filter 15. The wiring line 622 connects the connection node n1 and the transmission filter 16. The wiring line 623 connects the connection node n1 and the reception filter 13. The wiring line 624 connects the connection node n1 and the transmission filter 12. The wiring line 625 connects the connection node n1 and the transmission filter 14. The wiring line 626 connects the connection node n1 and the reception filter 11.

In the multiplexer 600 according to the second comparative example, only the connection node n1 is provided on the wiring line 621, which connects the common terminal 100 and the reception filter 15, and all the six acoustic wave filters are connected to the connection node n1 without the other connection nodes interposed between each of the six acoustic wave filters and the connection node n1.

With the above-described features in the multiplexer 600 according to the second comparative example, since only the connection node n1 is provided on the wiring line 621, for example, in the case where the common terminal 100 is located in the outer periphery of a region in which the six acoustic wave filters are provided and in the case where the acoustic wave filters are asymmetrically provided, the total length of the wiring lines connecting the common terminal 100 and the acoustic wave filters is longer than a total length in a structure in which a plurality of connection nodes exist on the wiring line 621. Consequently, the propagation loss of the multiplexer 600 is relatively high, which is disadvantageous for size reduction.

In the multiplexer 600 according to the second comparative example, when the mounting substrate 50 is viewed in plan view (viewed in the z-axis direction), for example, the size of each of the acoustic wave filters is about 0.8 mm×about 1.1 mm, and the size of each of the inductors 35 and 36 is about 0.4 mm×about 0.2 mm. The size of the multiplexer 600 is about 4.8 mm×about 4.0 mm and is larger than the size of each of the multiplexer 1 according to the present preferred embodiment and the multiplexer 500 according to the first comparative example. Note that these sizes are provided in the case where LTE bands 25, 66, and 30, which have been described above, are applied to the acoustic wave filters and where a multilayer substrate including a plurality of dielectric layers is provided as the mounting substrate 50.

In other words, if a plurality of connection nodes are provided on the wiring line connecting the common terminal 100 and the acoustic wave filters as in the present preferred embodiment and the first comparative example, the structure and features of the above-described wiring line are less likely to be limited than if only a single connection node is provided on the above-described wiring line as in the second comparative example. Accordingly, providing a plurality of connection nodes on the wiring line connecting the common terminal 100 and the acoustic wave filters more significantly reduces an overall size of a multiplexer than providing only a single connection node on the above-described wiring line.

In contrast, as another comparative example, in the case where a plurality of wiring lines are provided with each of the wiring lines connecting one of the acoustic wave filters and the common terminal 100 to each other, to provide a circuit in which the plurality of acoustic wave filters are connected to the common terminal 100, the total length of the wiring lines becomes relatively long depending on the position of the common terminal 100, and the propagation loss of the multiplexer becomes relatively high. Accordingly, a reduction is size is not able to be easily provided.

As described above, in a multiplexer that includes three or more acoustic wave filters connected to a common terminal, by providing a plurality of connection nodes on the wiring line connecting the common terminal 100 and the acoustic wave filters as in the present preferred embodiment and the first comparative example, the wiring line is able to be efficiently routed, and a significant size reduction is able to be provided. However, in the wiring of the first comparative example, it was determined that the high-frequency propagation characteristics deteriorated when a plurality of connection nodes were provided. In the following description, features of the multiplexer 1 according to the present preferred embodiment and features of the multiplexer 500 according to the first comparative example will be compared with respect to impedance matching, to describe and show a difference in high-frequency propagation characteristics.

Figure 4A:
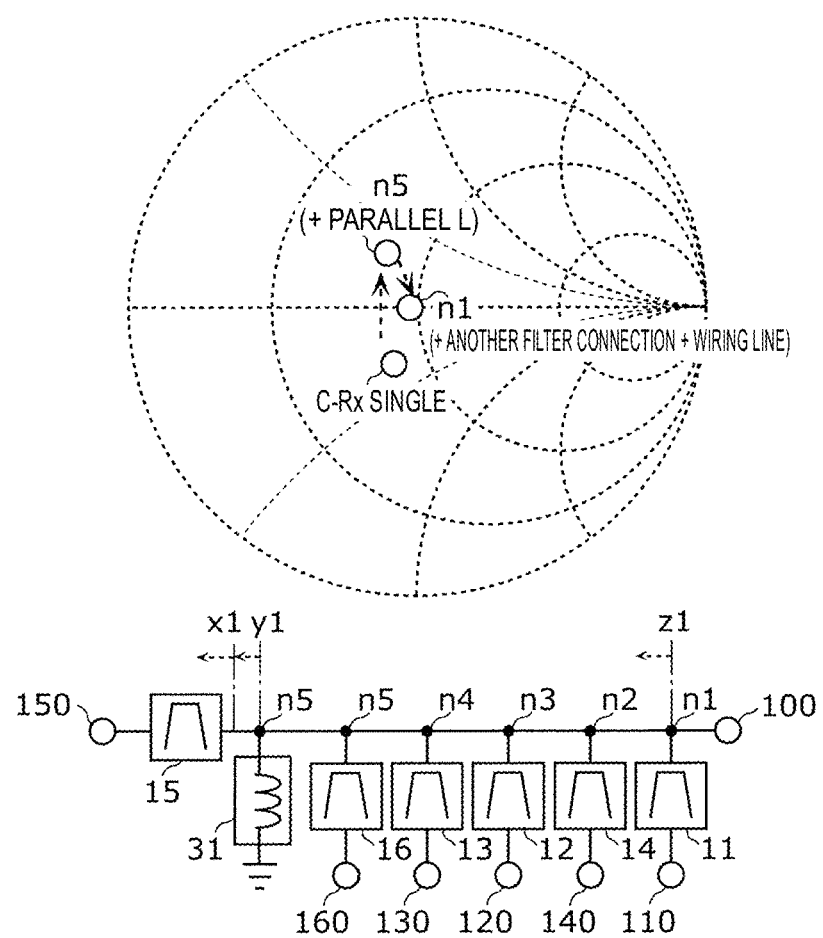
FIG. 4A is a Smith chart illustrating impedance characteristics of the multiplexer according to the preferred embodiment of the present invention.
Figure 4B:
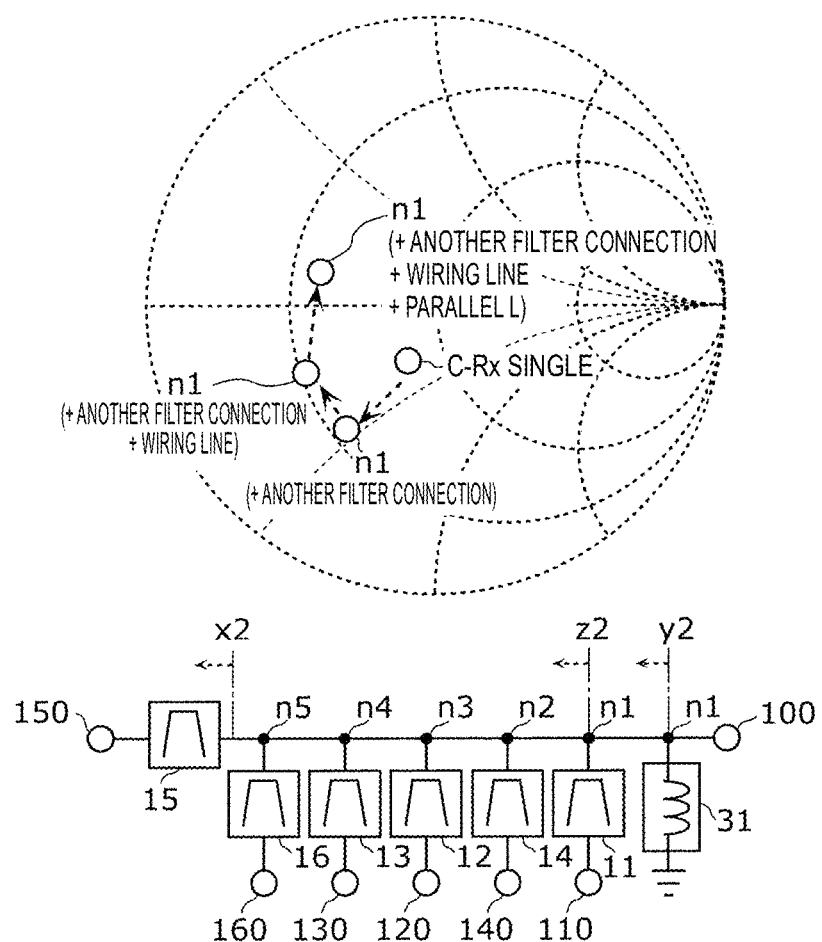
FIG. 4B is a Smith chart illustrating impedance characteristics of the multiplexer according to the first comparative example.

FIG. 4A is a Smith chart illustrating impedance characteristics of the multiplexer 1 according to the present preferred embodiment. FIG. 4B is a Smith chart illustrating impedance characteristics of the multiplexer 500 according to the first comparative example. More specifically, FIG. 4A illustrates impedances in pass bands when the acoustic wave filters are viewed from each of the connection nodes in the multiplexer 1 according to the present preferred embodiment. FIG. 4B illustrates impedances in pass bands when the acoustic wave filters are viewed from each of the connection nodes in the multiplexer 500 according to the first comparative example.

FIGS. 4A and 4B each illustrate a transition state in which the impedance changes sequentially from the reception filter 15, which is located at a position spaced apart from the common terminal 100 by the largest wiring distance, via each of the connection nodes (from n5 to n1) and in which the combined impedance of the acoustic wave filters is eventually matched to the reference impedance at the common terminal 100. The reception filters 11, 13, 15, and the transmission filters 12, 14, 16 are each an acoustic wave filter having a capacitive impedance, and the inductor 31 or 33 is added to shift the capacitive impedances of these filters to the inductive side.

First, in the multiplexer 500 according to the first comparative example, as illustrated in FIG. 4B, the impedance in a pass band (C-Rx) when the reception filter 15, which is located at a position spaced apart from the common terminal 100 by the largest wiring distance, is viewed alone (when the reception filter 15 is viewed from x2 in FIG. 4B) is in a capacitive region (C-Rx single in FIG. 4B).

Next, as illustrated in FIG. 4B, the other acoustic wave filters, which are the transmission filter 16, the reception filter 13, the transmission filters 12, 14, and the reception filter 11, are connected in parallel to the reception filter 15 at the connection nodes n5 to n1, respectively, the connection node n5 being farthest from the common terminal 100, and the connection nodes n1 being closest to the common terminal 100. Thus, the combined impedance of the above-mentioned six acoustic wave filters is shifted further toward the capacitive side and the low impedance side compared with the impedance of the single reception filter 15 (n1 (+another filter connection) in FIG. 4B). While the reception filters 11, 13 and the transmission filters 12, 14, are connected in parallel to the reception filter 15, the reception filter 15 passes through the connection nodes n5 to n1. Accordingly, the combined impedance of the six acoustic wave filters when viewed from the connection node n1 (in the state in which the inductor 31 is not connected thereto) (the impedance when the six acoustic wave filters connected in parallel to one another are viewed from z2 in FIG. 4B) is shifted, with respect to the combined impedance of the above-described six acoustic wave filters (n1 (+another filter connection) in FIG. 4B), in a clockwise direction along a constant resistance circle by the wiring line 521 (n1 (+another filter connection+wiring line) in FIG. 4B).

Next, as illustrated in FIG. 4B, the combined impedance of the above-mentioned six acoustic wave filters when viewed from the connection node n1 (the impedance when the six acoustic wave filters connected in parallel to one another are viewed from y2 in FIG. 4B) is shifted, at the connection node n1, in a counterclockwise direction on a constant conductance circle by the inductor 31, and are thus located in the inductive region (n1 (+another filter connection+wiring line+parallel L) in FIG. 4B). However, although the combined impedance of the above-described six acoustic wave filters is positioned in the inductive region by the inductor 31 at y2, the combined impedance of the above-mentioned six acoustic wave filters at z2 before the inductor 31 is added is significantly deviated from the reference impedance to the capacitive impedance side and the low impedance side. Thus, even if the combined impedance of the above-described six acoustic wave filters at y2 after the inductor 31 had been added is shifted in the counterclockwise direction on the constant conductance circle by the inductor 31, the combined impedance of the six acoustic wave filters will be located in the inductive region that is significantly deviated from the reference impedance to the low impedance side. Accordingly, the combined impedance of the above-described six acoustic wave filters, which are connected in parallel to one another, when viewed from the common terminal 100 (i.e., the impedance of the multiplexer 500) is significantly offset from the reference impedance to the low impedance side.

In contrast, in the multiplexer 1 according to the present preferred embodiment, as illustrated in FIG. 4A, the impedance in the pass band (C-Rx) when the reception filter 15, which is located at a position spaced apart from the common terminal 100 by the largest wiring distance, is viewed alone (when the reception filter 15 is viewed from x1 in FIG. 4A) is in the capacitive region (C-Rx single in FIG. 4A) as in the multiplexer 500 according to the first comparative example.

Next, as illustrated in FIG. 4A, the impedance of the reception filter 15 when viewed from the connection node n5 (the impedance when the reception filter 15 is viewed from y1 in FIG. 4A) is shifted, at the connection node n5, in the counterclockwise direction on the constant conductance circle by the inductor 31, and is thus located in the inductive region (n5 (+parallel L) in FIG. 4A). In other words, at y1 (the connection node n5), the impedance of the reception filter 15 before the reception filters 11, 13 and the transmission filters 12, 14, 16 are connected in parallel to the reception filter 15 is positioned in the inductive region by the inductor 31. In this case, the impedance of the reception filter 15 at x1 before the inductor 31 is added is a capacitive impedance that is closer to the reference impedance compared with the combined impedance of the six acoustic wave filters connected in parallel to one another. Thus, even if the impedance of the reception filter 15 at y1 (the connection node n5) after the inductor 31 has been added is shifted in the counterclockwise direction on the constant conductance circle by the inductor 31, the impedance of the reception filter 15 will be located in the inductive region while being close to the reference impedance.

Next, as illustrated in FIG. 4A, the combined impedance of the above-mentioned six acoustic wave filters when viewed from the connection node n1 (the impedance when the above-mentioned six acoustic wave filters connected in parallel to one another are viewed from z1 in FIG. 4A) is shifted in the counterclockwise direction on the constant resistance circle while being shifted in the clockwise direction on the constant conductance circle by the wiring line 21. However, since the impedance of the reception filter 15 at y1 (connection node n5) before the combined impedance is shifted as described above is located in the inductive region close to the reference impedance, the amount of the above-described shift is small. As a result, the combined impedance of the above-described six acoustic wave filters, which are connected in parallel to one another, when viewed from the common terminal 100 (i.e., the impedance of the multiplexer 1) becomes accurately matched to the reference impedance.

In other words, in the multiplexer 1 according to the present preferred embodiment, the parallel-connected inductor that shifts the combined impedance of the six acoustic wave filters, each of which has a capacitive impedance, to the inductive region is connected to one of the plurality of connection nodes that is located at a position where the common terminal 100 has not yet been shared by the six acoustic wave filters (the one connection node that is farthest from the common terminal 100). By connecting the inductor 31 to the reception filter 15, which is connected to the position spaced apart from the common terminal 100 by the largest wiring distance, before the other acoustic wave filters are connected to the reception filter 15 to shift the impedance of the reception filter 15 to the inductive region close to the reference impedance, the influence of impedance changes due to the addition of the subsequent wiring lines and the other acoustic wave filters may be minimized. As a result, the impedance of the multiplexer 1 can be prevented from being offset to the low impedance side.

In other words, the parallel-connected inductor 31 is connected between the ground and the wiring line 21 extending from the connection node n5, which is one of the connection nodes n1 to n5 and which is spaced apart from the common terminal 100 by the largest wiring distance, to the input end of the reception filter 15 or between the ground and the wiring line 22 extending from the connection node n5 to the output end of the transmission filter 16. That is, the parallel-connected inductor 31 is connected between the ground and the connection node n5, which is spaced apart from the common terminal 100 by the largest wiring distance, without the other connection nodes interposed therebetween.

FIGS. 5A to 5F include Smith charts comparing an impedance of the multiplexer 1 according to the present preferred embodiment and an impedance of the multiplexer 500 according to the first comparative example for each pass band. More specifically, FIG. 5A illustrates the impedance of the multiplexer 1 according to the present preferred embodiment and the impedance of the multiplexer 500 according to the first comparative example in a transmission band (A-Tx: about 1850 MHz to about 1915 MHz) of the band 25 when the multiplexer 1 and the multiplexer 500 are viewed from the common terminal 100. FIG. 5B illustrates the impedance of the multiplexer 1 according to the present preferred embodiment and the impedance of the multiplexer 500 according to the first comparative example in a reception band (A-Rx: about 1930 MHz to about 1995 MHz) of the band 25 when the multiplexer 1 and the multiplexer 500 are viewed from the common terminal 100. FIG. 5C illustrates the impedance of the multiplexer 1 according to the present preferred embodiment and the impedance of the multiplexer 500 according to the first comparative example in a transmission band (B-Tx: about 1710 MHz to about 1780 MHz) of the band 66 when the multiplexer 1 and the multiplexer 500 are viewed from the common terminal 100. FIG. 5D illustrates the impedance of the multiplexer 1 according to the present preferred embodiment and the impedance of the multiplexer 500 according to the first comparative example in a reception band (B-Rx: about 2110 MHz to about 2200 MHz) of the band 66 when the multiplexer 1 and the multiplexer 500 are viewed from the common terminal 100. FIG. 5E illustrates the impedance of the multiplexer 1 according to the present preferred embodiment and the impedance of the multiplexer 500 according to the first comparative example in a transmission band (C-Tx: about 2305 MHz to about 2315 MHz) of the band 30 when the multiplexer 1 and the multiplexer 500 are viewed from the common terminal 100. FIG. 5F illustrates the impedance of the multiplexer 1 according to the present preferred embodiment and the impedance of the multiplexer 500 according to the first comparative example in a reception band (C-Rx: about 2350 MHz to about 2360 MHz) of the band 30 when the multiplexer 1 and the multiplexer 500 are viewed from the common terminal 100.

As illustrated in FIGS. 5A to 5F, it is understood that, in each of the pass bands of the transmission and reception filters 11, 12, 13, 14, 15, and 16, the impedance of the multiplexer 1 according to the present preferred embodiment is closer to the reference impedance than the impedance of the multiplexer 500 according to the first comparative example is when viewed from the common terminal 100.

Figure 6A:
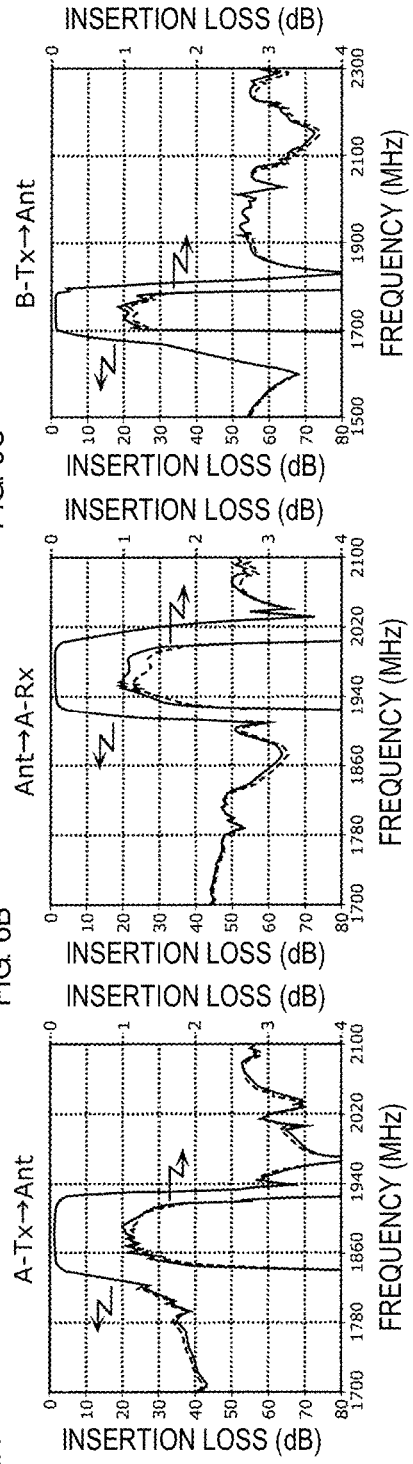
FIGS. 6A to 6F include graphs comparing bandpass characteristics of six filters according to the preferred embodiment of the present invention and bandpass characteristics of six filters according to the first comparative example.
Figure 6B:
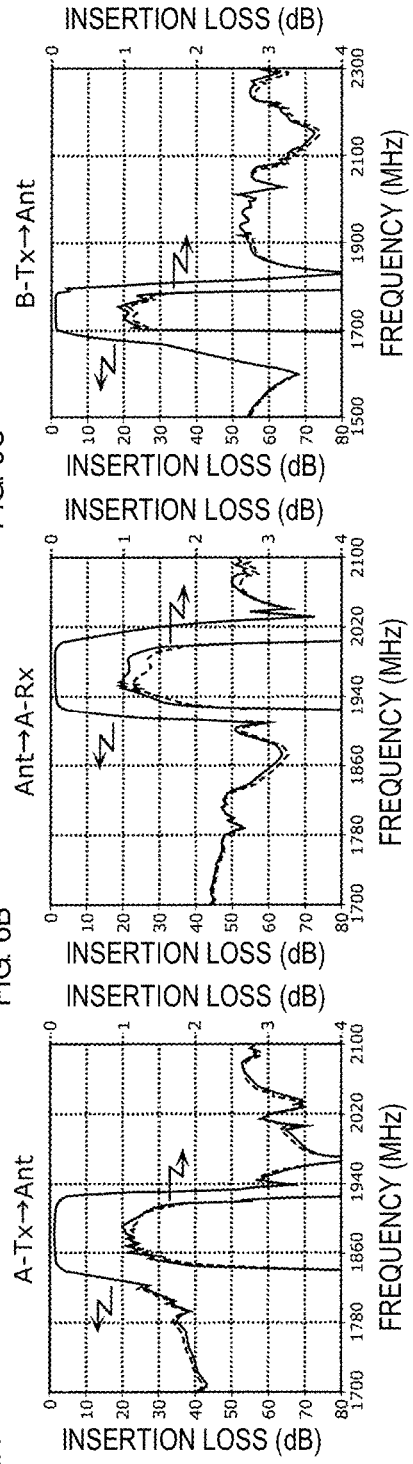
Figure 6C:
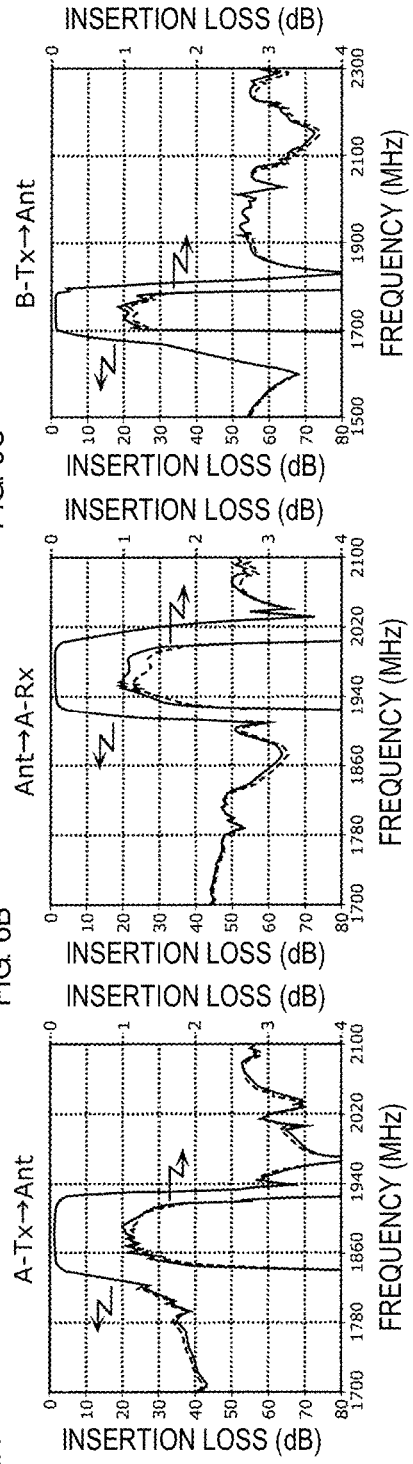
Figure 6D:
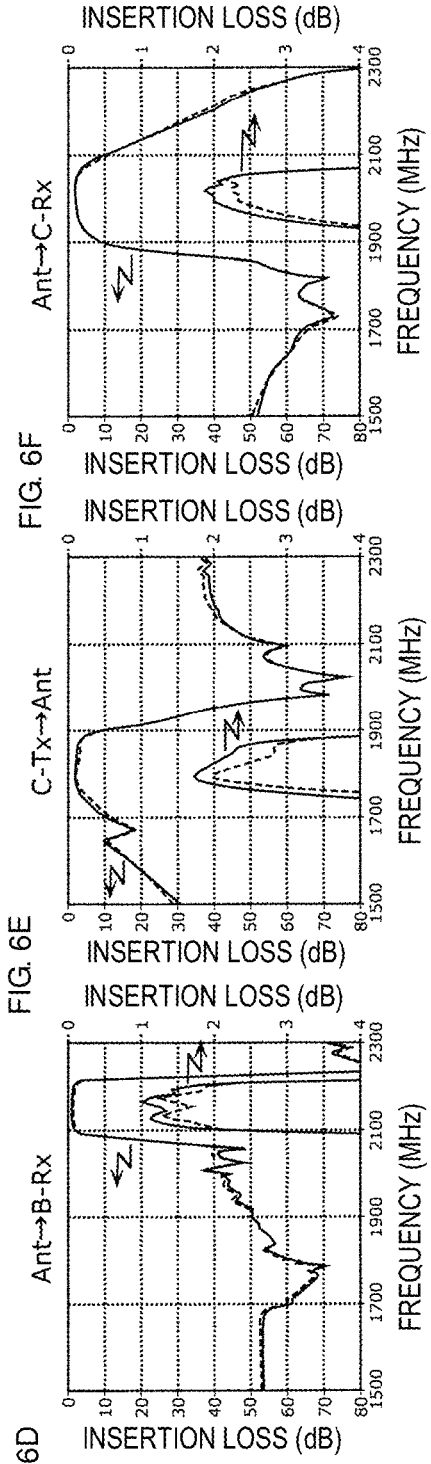
Figure 6E:
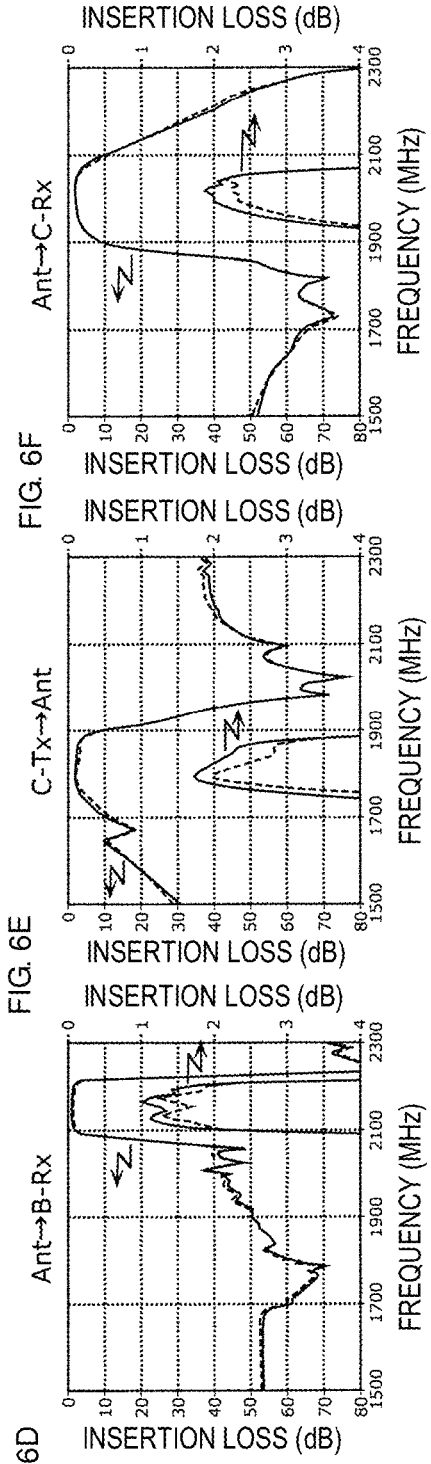
Figure 6F:
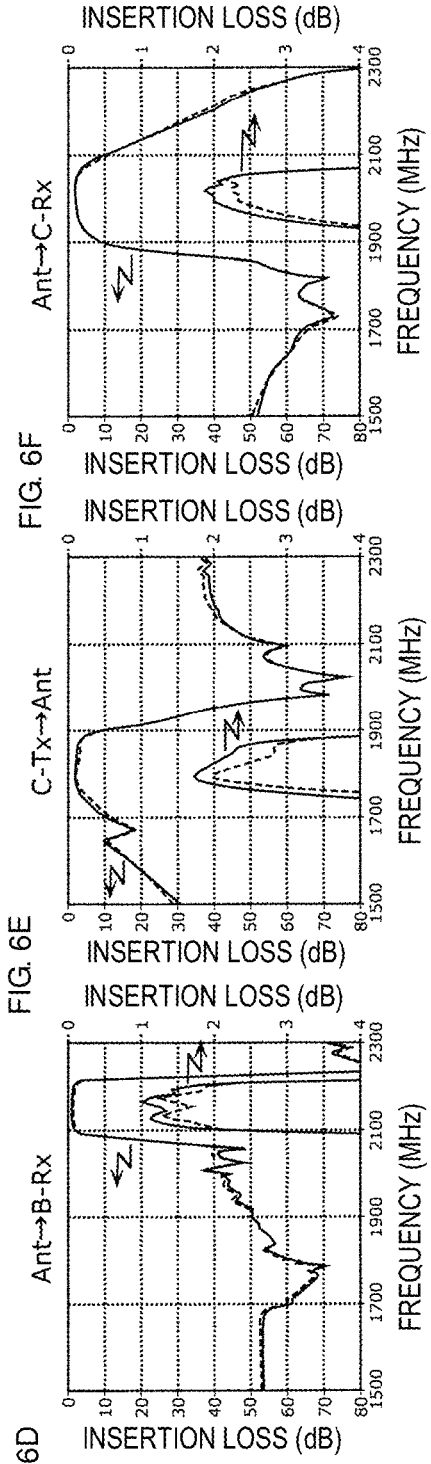

FIGS. 6A to 6F include graphs comparing bandpass characteristics of the six acoustic wave filters of the multiplexer according to the present preferred embodiment and bandpass characteristics of the six acoustic wave filters of the multiplexer according to the first comparative example. More specifically, FIG. 6A illustrates the bandpass characteristics of the transmission filter 12 located between the transmission input terminal 120 and the common terminal 100 in the multiplexer 1 according to the present preferred embodiment and the bandpass characteristics of the transmission filter 12 located between the transmission input terminal 120 and the common terminal 100 in the multiplexer 500 according to the first comparative example. FIG. 6B illustrates the bandpass characteristics of the reception filter 11 located between the common terminal 100 and the reception output terminal 110 in the multiplexer 1 according to the present preferred embodiment and the bandpass characteristics of the reception filter 11 located between the common terminal 100 and the reception output terminal 110 in the multiplexer 500 according to the first comparative example. FIG. 6C illustrates the bandpass characteristics of the transmission filter 14 located between the transmission input terminal 140 and the common terminal 100 in the multiplexer 1 according to the present preferred embodiment and the bandpass characteristics of the transmission filter 14 located between the transmission input terminal 140 and the common terminal 100 in the multiplexer 500 according to the first comparative example. FIG. 6D illustrates the bandpass characteristics of the reception filter 13 located between the common terminal 100 and the reception output terminal 130 in the multiplexer 1 according to the present preferred embodiment and the bandpass characteristics of the reception filter 13 located between the common terminal 100 and the reception output terminal 130 in the multiplexer 500 according to the first comparative example. FIG. 6E illustrates the bandpass characteristics of the transmission filter 16 located between the transmission input terminal 160 and the common terminal 100 in the multiplexer 1 according to the present preferred embodiment and the bandpass characteristics of the transmission filter 16 located between the transmission input terminal 160 and the common terminal 100 in the multiplexer 500 according to the first comparative example. FIG. 6F illustrates the bandpass characteristics of the reception filter 15 located between the common terminal 100 and the reception output terminal 150 in the multiplexer 1 according to the present preferred embodiment and the bandpass characteristics of the reception filter 15 located between the common terminal 100 and the reception output terminal 150 in the multiplexer 500 according to the first comparative example.

As illustrated in FIGS. 6A to 6F, in the bandpass characteristics of each of the transmission and reception filters 11, 12, 13, 14, 15, and 16, the insertion loss in each pass band in the multiplexer 1 according to the present preferred embodiment is more significantly reduced than that in the multiplexer 500 according to the first comparative example.

In other words, since the impedance of each pass band when viewed from the common terminal 100 in the multiplexer 1 according to the present preferred embodiment is closer to the reference impedance when compared with the impedance of each pass band when viewed from the common terminal 100 in the multiplexer 500 according to the first comparative example, the insertion loss in each pass band is significantly reduced.

The acoustic wave filter that is one of the six acoustic wave filters included in the multiplexer 1 according to the present preferred embodiment and that is spaced apart from the common terminal 100 by the largest wiring distance may have a pass band located on the highest frequency side. In the present preferred embodiment, the reception filter 15 is a reception filter of LTE band 30, and the transmission filter 16 is a transmission filter of LTE band 30. The reception filter 11 is a reception filter of LTE band 25, and the transmission filter 12 is a transmission filter of LTE band 25. The reception filter 13 is a reception filter of LTE band 66, and the transmission filter 14 is a transmission filter of LTE band 66. In this case, the reception filter 15 is spaced apart from the common terminal 100 by the largest wiring distance, and the pass band of the reception filter 15 is located on the highest frequency side.

According to the features and structure described above, since the pass band of the reception filter 15 has the highest frequency, among the six acoustic wave filters, the impedance of the reception filter 15 is most likely to be shifted to the capacitive side. The parallel-connected inductor 31 is connected to the reception filter 15 and positioned near the reception filter 15 without the other connection nodes or the other acoustic wave filters interposed therebetween. Thus, even in the case where the impedance of the single reception filter 15 is most shifted to the capacitive side, the impedance of the reception filter 15 when viewed from the common terminal 100 is able to be matched to the reference impedance. Accordingly, the combined impedance of the above-described six acoustic wave filters when viewed from the common terminal 100 is able to be matched to the reference impedance with higher accuracy.

In the present preferred embodiment, although the reception filter 15 is the acoustic wave filter that is spaced apart from the common terminal 100 by the largest wiring distance, the transmission filter 16 may be the acoustic wave filter that is spaced apart from the common terminal 100 by the largest wiring distance. Although the pass band of the transmission filter 16 is technically located further toward the low frequency side than the pass band of the reception filter 15 is, the communication band of the transmission filter 16 and the communication band of the reception filter 15 are both the band 30. The communication band of the transmission filter 12 and the communication band of the reception filter 11 are both the band 25. The communication band of the transmission filter 14 and the communication band of the reception filter 13 are both the band 66. In this case, the communication band of the transmission filter 16 is one of the three communication bands that is on the highest frequency side. Also in this case, the parallel-connected inductor 31 is connected the transmission filter 16 and the reception filter 15, which are shifted further toward the capacitive side, so as to be positioned near the transmission filter 16 and the reception filter 15 without the other connection nodes or the other acoustic wave filters interposed between the inductor 31 and the filters 15 and 16. Accordingly, the combined impedance of the above-described six acoustic wave filters when viewed from the common terminal 100 is able to be matched to the reference impedance with relatively high accuracy.

3. Structure of Acoustic Wave Filter

FIGS. 7A to 7C include sectional views each illustrating a resonator of one of the acoustic wave filters included in the multiplexer 1 according to the present preferred embodiment.

The reception filters 11, 13, 15 and the transmission filters 12, 14, 16, which are included in the multiplexer 1 according to the present preferred embodiment, are each an acoustic wave filter and each include one or more acoustic wave resonators. For example, the reception filters 11, 13, 15 and the transmission filters 12, 14, 16 according to the present preferred embodiment are each a ladder acoustic wave filter that includes a serial-arm acoustic wave resonator and a parallel-arm acoustic wave resonator. FIGS. 7A to 7C each illustrate a sectional structure of one of the acoustic wave resonators of the above-mentioned six acoustic wave filters, the one being the acoustic wave resonator included in the reception filter 15. The above-described acoustic wave resonator typically includes a substrate 250 having piezoelectricity and an interdigital transducer (IDT) electrode 260 as illustrated in FIG. 7A.

The IDT electrode 260 is defined by a pair of comb-shaped electrodes facing each other and is formed on the substrate 250. More specifically, each of the above-described pair of comb-shaped electrodes includes, for example, a plurality of electrode fingers that are parallel to one another and a busbar electrode that connects the plurality of electrode fingers.

The substrate 250 includes a support substrate 253, an energy confinement layer 252, and a piezoelectric layer 251 and has a structure in which the support substrate 253, the energy confinement layer 252, and the piezoelectric layer 251 are laminated together in this order in the z-axis direction.

The piezoelectric layer 251 is preferably made of, for example, a LiTaO$_3$ piezoelectric single crystal or a piezoelectric ceramic.

The support substrate 253 is a substrate that supports the piezoelectric layer 251, the energy confinement layer 252, and the IDT electrode 260.

The energy confinement layer 252 includes one or a plurality of layers, and the velocity of an acoustic bulk wave propagating through at least one layer included in the energy confinement layer 252 is greater than the velocity of an acoustic wave propagating in a vicinity of the piezoelectric layer 251. For example, as illustrated in FIG. 7B, the energy confinement layer 252 has a multilayer structure defined by a low-acoustic-velocity layer 254 and a high-acoustic-velocity layer 255. The low-acoustic-velocity layer 254 is a film in which the acoustic velocity of a bulk wave in the low-acoustic-velocity layer 254 is lower than the acoustic velocity of an acoustic wave propagating through the piezoelectric layer 251. The high-acoustic-velocity layer 255 is a film in which the acoustic velocity of a bulk wave in the high-acoustic-velocity layer 255 is higher than the acoustic velocity of an acoustic wave propagating through the piezoelectric layer 251. Note that the support substrate 253 may serve as a high-acoustic-velocity layer.

The energy confinement layer 252 is, for example, an acoustic impedance layer 258 in which low-acoustic-impedance layers 256 each having a relatively low acoustic impedance and high-acoustic-impedance layers 257 each having a relatively high acoustic impedance are alternately laminated together as illustrated in FIG. 7C.

With the above-described features and structure of the acoustic wave filter included in the multiplexer 1 according to the present preferred embodiment, the impedance of an acoustic wave filter that includes the substrate 250 having piezoelectricity is likely to be capacitive because the dielectric constant of the piezoelectric layer 251 is relatively high. Even in this case, the impedance of the reception filter 15 when viewed from the common terminal 100 is able to be brought close to the reference impedance, and the impedance of the multiplexer 1 when viewed from the common terminal 100 is able to be matched to the reference impedance.

The reception filters 11, 13, 15 and the transmission filters 12, 14, 16, which are included in the multiplexer 1 according to the present preferred embodiment, are each preferably defined by, for example, a surface acoustic wave (SAW) resonator that includes the above-described multilayer structure. Each of the above-described six acoustic wave filters is not limited to the above-described surface acoustic wave device and may be a bulk acoustic wave (BAW) device, a film bulk acoustic resonator (FBAR), or the like. Note that the SAW includes not only a surface acoustic wave but also a boundary wave.

As described above, the multiplexer 1 according to the present preferred embodiment includes the common terminal 100, the reception filter 15 (first acoustic wave filter) connected to the common terminal 100, the wiring line 21 (first wiring line) connecting the common terminal 100 and the reception filter 15 to each other, the transmission filter 16 (second acoustic wave filter) connected to the connection node n5 on the wiring line 21, the transmission and reception filters 11, 12, 13 and 14 (third acoustic wave filters) connected to the connection nodes n4 to n1 on the wiring line 21, the wiring line 22 (second wiring line) connecting the connection node n5 and the transmission filter 16 to each other, the wiring lines 23 to 26 (third wiring lines) connecting the connection nodes n4 to n1 to the reception filters 11, 13 and the transmission filters 12, 14, and the inductor 31 connected between a wiring region of the wiring line 21 that extends from the connection node n5 to the reception filter 15 and the ground or between the wiring line 22 and the ground. The length of the wiring line 21 extending from the common terminal 100 to the connection node n5 is longer than the length of each of the wiring line extending from the common terminal 100 to the connection node n4, the wiring line extending from the common terminal 100 to the connection node n3, the wiring line extending from the common terminal 100 to the connection node n2, and the wiring line extending from the common terminal 100 to the connection node n1.

With the above-described structure and features in the multiplexer 1 according to the present preferred embodiment, since there are a plurality of connection nodes on the wiring line 21, the positions of the common terminal 100 and the acoustic wave filters are not limited, and the total length of the wiring lines connecting the common terminal 100 and the acoustic wave filters is able to be shortened compared with the structure in which there is one connection node on wiring line 21.

In addition, the inductor 31, which applies phase-shifting to the capacitive impedance of each of the acoustic wave filters, is connected to a wiring region in which the reception filter 15, which is positioned farthest from the common terminal 100, has not yet been connected to the transmission filter 16. In other words, the inductor 31 is connected to a wiring region farthest from the common terminal 100 rather than a position closest to the common terminal 100. Thus, according to the reception filter 15 being connected in parallel to the other acoustic wave filters each having a capacitive impedance, the impedance of the reception filter 15 at the connection node n5 is shifted in an inductive direction while being close to the reference impedance by the inductor 31 without deviating from the reference impedance toward the capacitive and low-impedance area. Although the impedance of the reception filter 15 is shifted to the capacitive side as a result of the reception filter 15 being connected in parallel to the other acoustic wave filters, the impedance of the reception filter 15 is shifted from the inductive state close to the reference impedance to the capacitive side, and thus, the combined impedance of the six acoustic wave filters as viewed from the common terminal 100 is able to be matched to the reference impedance.

Accordingly, with the above-described structure of the plurality of connection nodes and the inductor 31, a reduction in the loss of the multiplexer 1 and a reduction in the size of the multiplexer 1 is able to be provided.

Although the multiplexer according to the present invention has been described above with respect to the preferred embodiment described above, the present invention is not limited to the above-described preferred embodiment. Modifications that are obtained by making various modifications, which are devised by those skilled in the art within the gist of the present invention, to the above-described preferred embodiment and various devices each of which includes the multiplexer according to the present invention provided therein are also included in the scope of the present invention.

In addition, for example, in the multiplexer according to the preferred embodiment, a matching element such as an inductor or a capacitor and a switch circuit may be connected between the components. Note that the inductor may include a wiring inductor defined by a wiring line connecting the components.

The present invention is able to be widely implemented as a low-loss multiplexer that is applicable to a multi-band and multi-mode frequency standard in communication devices, for example, cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
    a common terminal;
    a first acoustic wave filter connected to the common terminal;
    a first wiring line connecting the common terminal and the first acoustic wave filter to each other without a capacitor being connected in series between the common terminal and the first acoustic wave filter;
    a second acoustic wave filter connected to a first connection node on the first wiring line;
    a third acoustic wave filter connected to a second connection node on the first wiring line;
    a second wiring line connecting the first connection node and the second acoustic wave filter to each other;
    a third wiring line connecting the second connection node and the third acoustic wave filter to each other; and
    an inductance element connected between a wiring region of the first wiring line that extends from the first connection node to the first acoustic wave filter and a ground or between the second wiring line and the ground; wherein
    a length of a portion of the first wiring line extending from the common terminal to the first connection node is longer than a length of a portion of the first wiring line extending from the common terminal to the second connection node; and
    the common terminal is connected to the ground by the inductance element without a capacitor.

2. The multiplexer according to claim 1, wherein
    the first acoustic wave filter, the second acoustic wave filter, and the third acoustic wave filter are each provided on a substrate having piezoelectricity;
    the first acoustic wave filter, the second acoustic wave filter, and the third acoustic wave filter are each defined by an acoustic wave resonator that includes an interdigital transducer (IDT) electrode;
    the substrate includes a support substrate, a piezoelectric layer that has a surface on which the IDT electrode is provided, and an energy confinement layer that is positioned between the support substrate and the piezoelectric layer and that is able to confine acoustic wave energy; and
    the energy confinement layer includes a plurality of layers through which a bulk wave propagates at different acoustic velocities or a plurality of layers that have different acoustic impedances.

3. The multiplexer according to claim 2, wherein the IDT electrode is defined by a pair of comb-shaped electrodes that face each other and are provided on the substrate.

4. The multiplexer according to claim 2, wherein the support substrate, the energy confinement layer, and the piezoelectric layer are laminated together in this order.

5. The multiplexer according to claim 2, wherein
    the energy confinement layer includes a plurality of low-acoustic-impedance layers and a plurality of high-acoustic-impedance layers that are alternately laminated together;
    an acoustic velocity of an acoustic wave propagating through each of the plurality of low-acoustic-impedance layers is lower than an acoustic velocity of the acoustic wave propagating through the piezoelectric layer; and
    an acoustic velocity of the acoustic wave propagating through each of the plurality of low-acoustic-impedance layers is higher than the acoustic velocity of the acoustic wave propagating through the piezoelectric layer.

6. The multiplexer according to claim 1, further comprising:
    a mounting substrate on which the common terminal, the first acoustic wave filter, the second acoustic wave filter, and the third acoustic wave filter are mounted; wherein
    the first wiring line, the second wiring line, and the third wiring line are provided on the mounting substrate; and
    the inductance element is a chip inductor that is surface-mounted on the mounting substrate or an inductor that defined by a coil pattern in the mounting substrate.

7. The multiplexer according to claim 6, wherein the mounting substrate is a multilayer substrate that includes a plurality of dielectric layers.

8. The multiplexer according to claim 1, wherein a pass band of the first acoustic wave filter is located further toward a high frequency side than each of pass bands of the second acoustic wave filter and the third acoustic wave filter is.

9. The multiplexer according to claim 1, wherein a pass band of at least one of the first acoustic wave filter, the second acoustic wave filter, and the third acoustic wave filter is LTE band 25, LTE band 30, or LTE band 66.

10. The multiplexer according to claim 1, further comprising a second inductance element connected in series between the first connection node and an input of the first acoustic wave filter.

11. The multiplexer according to claim 1, wherein
    the first acoustic wave filter is a first reception filter,
    the second acoustic wave filter is a transmission filter; and
    the third acoustic wave filter is a second reception filter.

12. The multiplexer according to claim 1, wherein at least one of the first acoustic wave filter, the second acoustic wave filter, and the third acoustic wave filter is a ladder acoustic wave filter that includes a serial-arm acoustic wave resonator and a parallel-arm acoustic wave resonator.

13. The multiplexer according to claim 1, wherein the first acoustic wave filter, the second acoustic wave filter, and the third acoustic wave filter are each defined by a surface acoustic wave (SAW) resonator.

* * * * *